United States Patent [19]
Han et al.

[11] Patent Number: 6,104,444
[45] Date of Patent: Aug. 15, 2000

[54] MONITOR WITH A MOUNT FOR A SUPPLEMENTAL PRINTED CIRCUIT BOARD

[75] Inventors: Jeong-Seon Han; Dae-Il Chung, both of Suwon, Rep. of Korea

[73] Assignee: SamSung Electronics Co., Ltd., Suwon, Rep. of Korea

[21] Appl. No.: 09/084,932

[22] Filed: May 28, 1998

[30] Foreign Application Priority Data

May 28, 1997 [KR] Rep. of Korea ...................... 97-12285
Jul. 31, 1997 [KR] Rep. of Korea ...................... 97-21229

[51] Int. Cl.$^7$ ..................................................... G01R 1/20
[52] U.S. Cl. ......................... 348/836; 348/839; 361/682
[58] Field of Search ............................ 361/682; 348/836, 348/839; 312/7.2

[56] References Cited

U.S. PATENT DOCUMENTS

| | | | |
|---|---|---|---|
| 5,740,019 | 4/1998 | Lee | 361/759 |
| 5,777,699 | 7/1998 | Shim | 348/830 |
| 5,863,106 | 1/1999 | Beak | 312/7.2 |
| 5,900,920 | 5/1999 | Lee et al. | 348/836 |
| 5,969,776 | 10/1999 | Han | 348/836 |
| 6,018,375 | 1/2000 | Lim | 348/836 |

*Primary Examiner*—Lynn D. Feild
*Attorney, Agent, or Firm*—Robert E. Bushnell, Esq.

[57] ABSTRACT

A supplemental printed circuit board package is provided that can be directly interfaced with the main printed circuit board of a monitor. A monitor using the improved supplemental printed circuit board package may be constructed using a cathode ray tube, a main printed circuit board, a bracket for supporting the main printed circuit board, and supplemental printed circuit board package that is installed on the main printed circuit board. The package may be secured to the first bracket using a multitude of clips that are secured inside of slots in along the rear edge of the first bracket. The use of this improved supplemental printed circuit board package will dramatically simplify the construction of high performance monitors that have a screen size of twenty inches or greater.

20 Claims, 5 Drawing Sheets

MONITOR WITH A MOUNT FOR A SUPPLEMENTAL PRINTED CIRCUIT BOARD

CLAIM OF PRIORITY

This application makes reference to, incorporates the same herein, and claims all rights accruing thereto under 35 U.S.C. §119 through my patent application entitled *Subsidiary PCB Unit, Method for Mounting the Same, and Monitor Comprising the Same* earlier filed in the Korean Industrial Property Office on the 28th day of May 1997 and there duly assigned Ser. No. 1997/12285.

BACKGROUND OF THE INVENTION

1. Field of the Invention

The present invention relates to monitor having a supplemental printed circuit board and, more specifically, to a video monitor having a mounting structure for engaging a supplemental printed circuit board package while directly interfacing the supplemental printed circuit board with a main printed circuit board.

2. Background Art

A monitor is generally constructed using a stand and a chassis that is assembled using a front cover and a rear cover. The chassis typically contains a cathode ray tube and a printed circuit board. The increasing performance demands for display devices, resulting from widespread use of multimedia applications in conjunction with a personal computer, has led to the development of various techniques to increase the overall quality of display devices. One method of enhancing monitor performance has necessitated supplementation of the main printed circuit board with additional supplemental printed circuit boards. Generally, the positioning of a supplemental printed circuit board that is used with a monitor is determined by both the size of the supplemental printed circuit board and position relative to the size of the screen of the cathode ray tube. In a monitor that uses a large cathode ray tube, the volume of the monitor is too large to accept attachment of a supplemental printed circuit board to the cathode ray tube itself. In monitors that use a small cathode ray tube, the weight of the cathode ray tube is low enough to allow the supplemental printed circuit board to be mounted onto the cathode ray tube. One method used in monitors that have large cathode ray tubes, a cathode ray tube with a screen of more than twenty inches, is to attach the supplemental printed circuit boards to the main printed circuit board of the monitor.

The chassis of a large monitor may be constructed using a front cover, a rear cover, and a bottom cover. A second bracket may be installed on the front cover, and the second bracket may also be used to support the cathode ray tube. The front portion of a first bracket is fixed to the second bracket by using a fastener. A main printed circuit board that supports various electronic components is installed on the first bracket. A rear printed circuit board is coupled to the electron gun of the cathode ray tube. Another supplemental printed circuit board may be located separately from the rear printed circuit board that is installed on the main printed circuit board. This supplemental printed circuit board is installed above the main printed circuit board within a front shield and a rear shield. The supplemental printed circuit board is connected via a cable to the rear printed circuit board and the main printed circuit board. The shields prevent the leakage of electromagnetic waves. The front shield, the supplemental printed circuit board, and the rear shield form an integral package unit. Hereinafter, the combination of the front shield, the supplemental printed circuit board, and the rear shield will be referred to as a "supplemental printed circuit board package". Within the supplemental printed circuit board package, there is a space between the front and rear shields that accommodates the electronic components of the supplemental printed circuit board. Leg portions extend downwardly from the lower side edges of the front shield and are fixed to the first bracket by fasteners such as a bolt and a washer. The bolt is fastened into a screw hole in the leg portion after passing through a cut-off groove, while the washer is coupled to the bolt. Then, when the shield is positioned on the main printed circuit board, the bolt passes through the cut-off groove of the first bracket and is completely fastened into the screw hole in the leg portion. Thus, the front shield fixedly coupled to the first bracket.

We have found one drawback, however, is that the leg portions of the shield a coupled to the rear portions of the first bracket by a another fastener. Thus, the upper portion of the shield projects further upward to avoid having the supplemental printed circuit board package interfere with the operation of the cathode ray tube that is installed on the second bracket. Furthermore, the chassis that accommodates the cathode ray tube and the shield has to have a sufficient space to properly house all of the various components. As such, the total height of the monitor has had to be increased, thus requiring an increase in the overall size of the monitor.

Furthermore, an additional drawback of this supplemental printed circuit board mounting technique is that only the lower two edges of the supplemental printed circuit board package are fixed. This allows the supplemental printed circuit board package to be rotated when even a small force is imposed on the package. This however can lead to unexpected damage to or a reduction in the performance of the monitor. Additionally, the supplemental printed circuit board package is connected to the main printed circuit board via a cable, thus necessitating an increased number of steps to complete the assembly process and an increase in the complication of the peripheral structure. As such, we believe that it may be possible to improve on the art of the mounting of supplemental printed circuit boards by providing a supplemental printed circuit board package that can be directly attached to a main printed circuit board, that does not rotate when a force is applied to the package, that does not increase the manufacturing complexity by requiring that a cable be used to connect the supplemental printed circuit board to the main printed circuit board, and that does not require that the size of the monitor chassis be increased.

SUMMARY OF THE INVENTION

Accordingly, it is an object of the present invention to provide an improved supplemental printed circuit board package.

It is another object to provide a supplemental printed circuit board package that does not rotate when a force is exerted on the package.

It is still another object to provide a supplemental printed circuit board package that is easy to install during the manufacturing process.

It is yet another object to provide a supplemental printed circuit board package that directly interfaces with the main printed circuit board.

It is a further object to provide a supplemental printed circuit board package that does not require that the size of the monitor chassis be increased.

It is a further object still to provide a supplemental printed circuit board package that increases the efficiency of the manufacture and assembly of video monitor.

To achieve these and other objects, a supplemental printed circuit board package is provided that can be directly interfaced with the main printed circuit board of a video monitor. A monitor using the improved supplemental printed circuit board package may be constructed using a cathode ray tube, a main printed circuit board, a bracket for supporting the main printed circuit board, and supplemental printed circuit board package that is installed on the main printed circuit board. The package may be secured to the first bracket using a multitude of clips that are secured inside slots along the rear edge of the first bracket. Use of this improved supplemental printed circuit board package will dramatically simplify the construction of high performance video monitors, particularly those monitors that have a screen size of twenty inches or greater.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols, indicate the same or similar components, wherein.

DETAILED DESCRIPTION OF THE DRAWINGS

Figure 1:
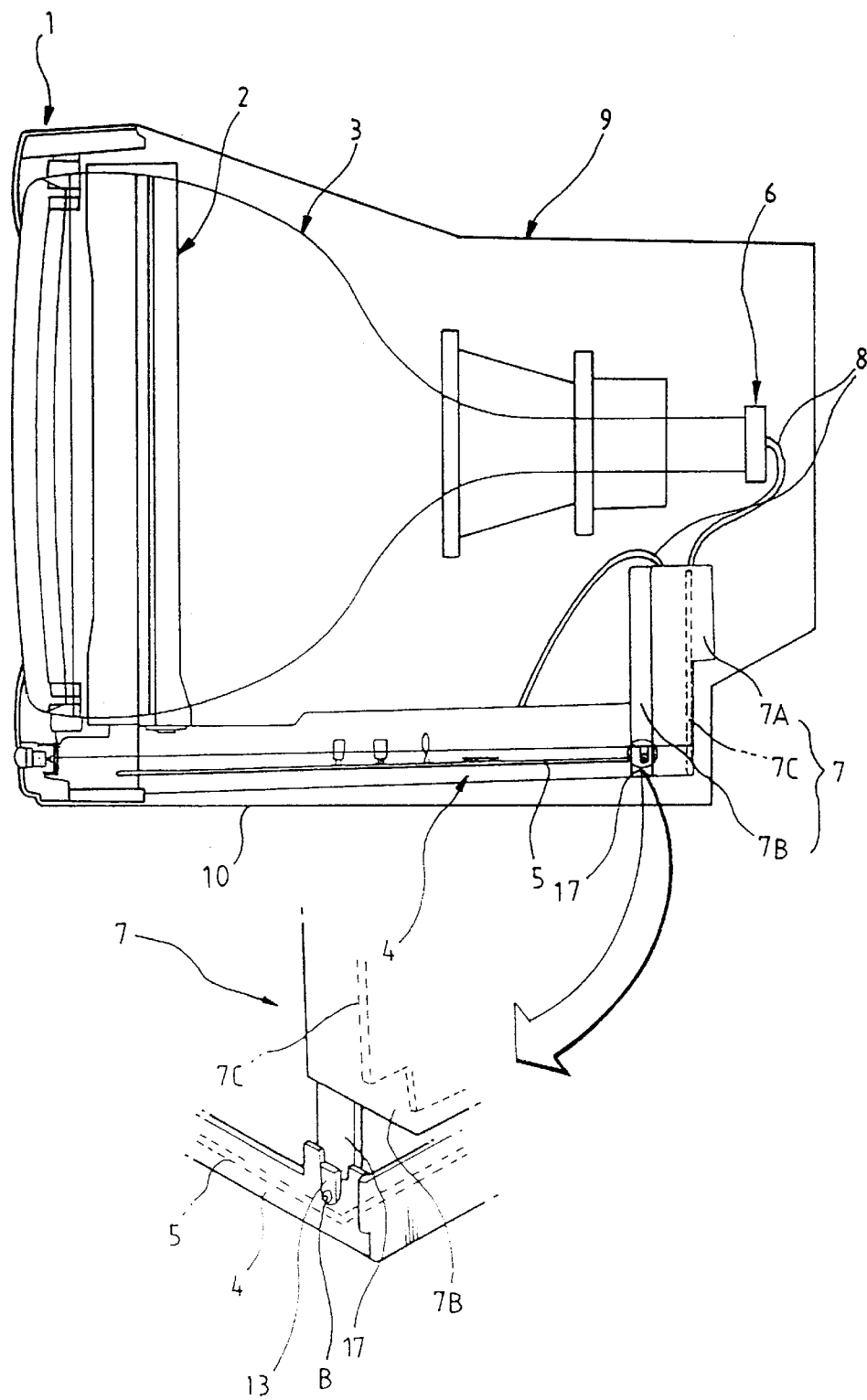
FIG. 1 is schematic side view of a large monitor that illustrates some features of importance during the installation of a supplemental printed circuit board package.

Turning now to the drawings, FIG. 1 illustrates a large monitor that has two additional printed circuit boards installed in addition to the main printed circuit board. The chassis of the monitor may be constructed using front cover 1, interface 1A, rear cover 9, inner housing 9A, and bottom cover 10. Second bracket 2 is installed on front cover 1, and second bracket 2 may also be used to support cathode ray tube 3. The front portion of first bracket 4 is fixed to second bracket 2 by a fastening. Main printed circuit board 5 bears various electronic components that are installed on it and, that together with the main printed circuit board, are mounted on first bracket 4.

Rear printed circuit board 6 is coupled to the electron gun of cathode ray tube 3. Supplemental printed circuit board 7C is located separately from rear printed circuit board 6 and is installed over main printed circuit board 5. Supplemental printed circuit board 7C is installed within shields 7A and 7B and is connected to rear printed circuit board 6 and main printed circuit board 5 via cable 8. Shields 7A and 7B prevent the leakage of electromagnetic waves. Front shield 7B, supplemental printed circuit board 7C, and rear shield 7A form integral package unit 7. Hereinafter, the combination of front shield 7B, supplemental printed circuit board 7C, and rear shield 7A will be referred to as "supplemental printed circuit board package 7". Within supplemental printed circuit board package 7, there is a space between front and rear shields 7B and 7A that accommodates the electronic components of supplemental printed circuit board 7C. Leg portions 17 extend downward from lower side edges of front shield 7B. Leg portions 17 are fixed to first bracket 4 by means of fastening members as shown in the enlarged part of FIG. 1.

Fastening members consists of bolt B and washer 13. Bolt B is fastened into a screw hole in leg portion 17 after passing through a cut-off groove, while washer 13 is coupled to bolt B. Then, when shield 7B is positioned on main printed circuit board 5, as shown in FIG. 1, the bolt passes through the cut-off groove of first bracket 4. Then, bolt B is completely fastened into the screw hole in leg portion 17. Thus, shield 7B is fixedly coupled to first bracket 4.

Figure 2:
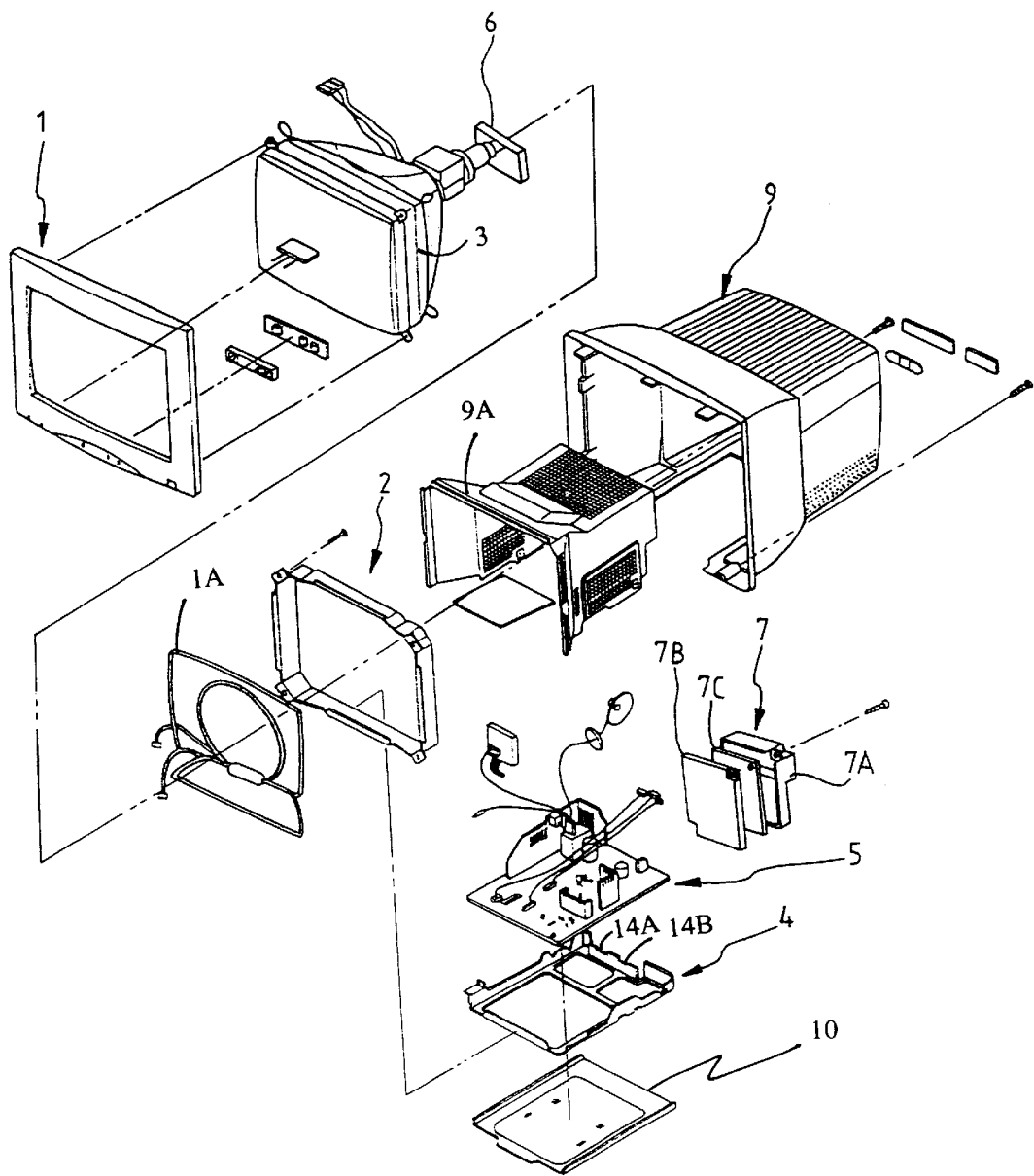
FIG. 2 is an exploded perspective view of a monitor illustrating a supplemental printed circuit board pa(age as constructed according to the principles of the present invention of the present invention and how the supplemental printed circuit board package is positioned relative to the main printed circuit board.

A supplemental printed circuit board package as constructed according to the principles of the present invention is illustrated in FIG. 2. A monitor containing such a supplemental printed circuit board package may be constructed using cathode ray tube 3, that is fixed to second bracket 2 that is attached to front cover 1. Beneath second bracket 2, there is first bracket 4 that is fastened along an edge to second bracket 2. Front cover 1 is coupled to rear cover 9. First bracket 4 supports main printed circuit board 5 that has various circuit components attached. Rear printed circuit board 6 is coupled to the rear end of an electron gun of cathode ray tube 3. Supplemental printed circuit board 7C is separately positioned from rear printed circuit board 6 and board 7C is inserted between front shield 7B and rear shield 7A, thus forming supplemental printed circuit board package 7. Supplemental printed circuit board package 7 is installed on main printed circuit board 5 in a somewhat perpendicular fashion. Supplemental printed circuit board 7C is connected through connectors 11 and 12 to main printed circuit board 5.

Figure 3:
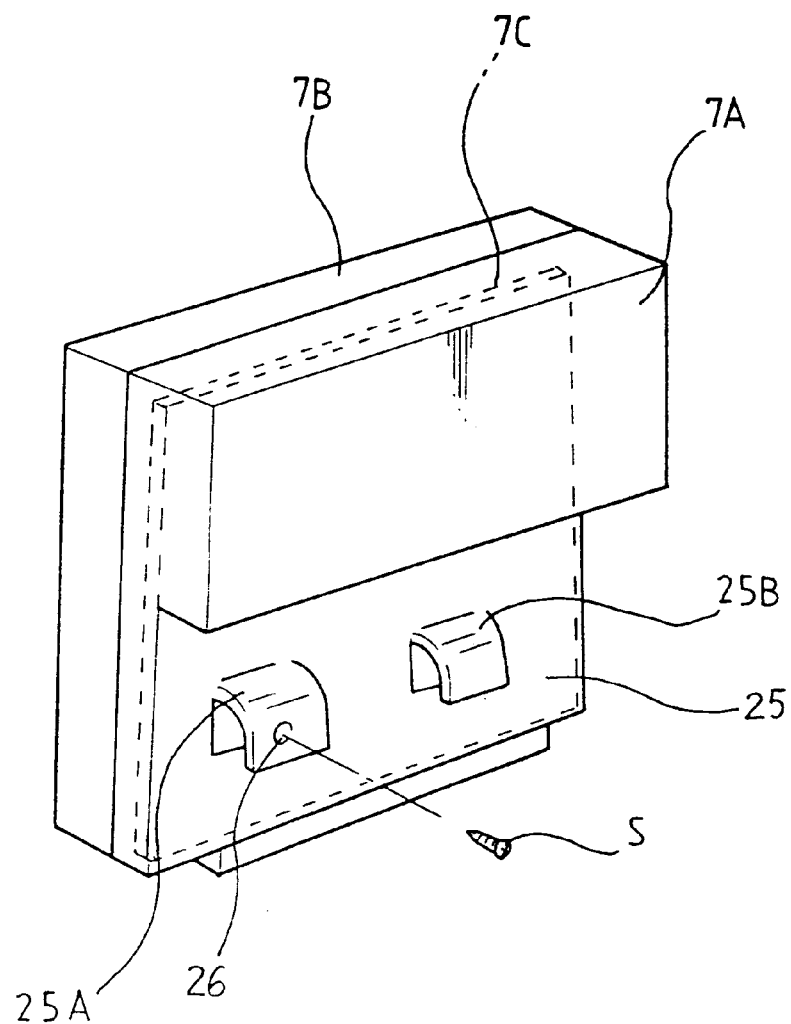
FIG. 3 is a perspective view of the supplemental printed circuit package of FIG. 2.
Figure 4:
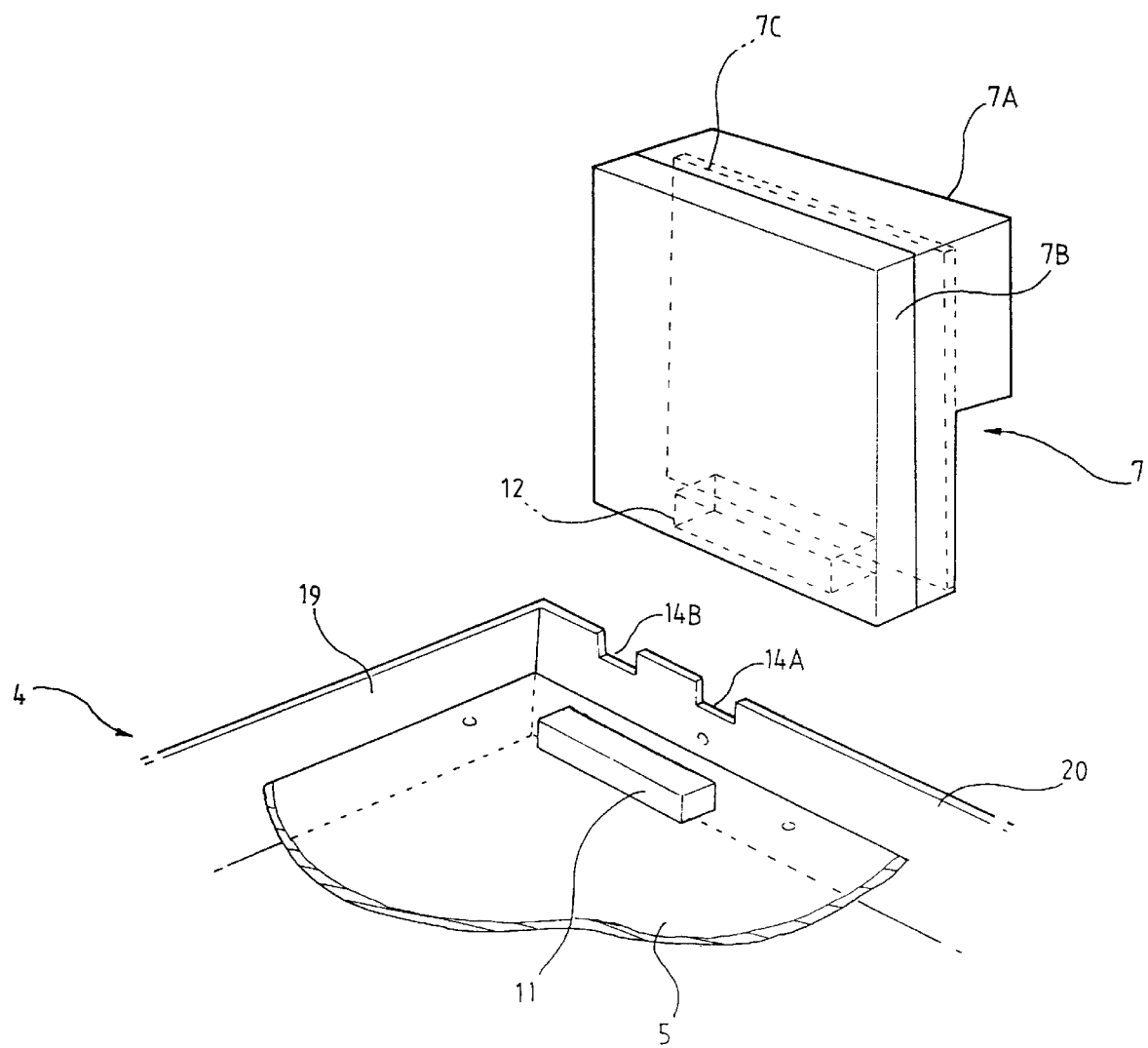
FIG. 4 is a partially exploded perspective view of the main printed circuit board and the supplemental printed circuit board package of FIG. 2.

As can be seen in FIGS. 3 and 4, supplemental printed circuit board 7C is positioned between shields 7A and 7B. Two clips 25A and 25B project from rear face 25 of rear shield 7A. Clips 25A and 25B may be formed by cutting portions of rear shield 7A and by bending the cut portions. Alternatively, the two clips can be formed integrally with the rear shield through either a welding process, an injection molding process, or via a pressing process. Rear wall 20 of first bracket 4 has two slots 14A and 14B positioned to receive clips 25A and 25B. Clips 25A and 25B are then attached to the first bracket along the bottom of slots 14A and 14B. This restricts the movement of the supplemental printed circuit board package 7 and increases the reliability of the monitor. The clip 25A further prevents supplemental printed circuit board package 7 from being moved by having fastener S inserted through bore 26. This further prevents supplemental printed circuit board package 7 from becoming disengaged from main printed circuit board 5. First connector 11 is electrically connected to main printed circuit board 5 and is designed to mate with second connector 12 that is electrically connected to supplemental printed circuit board 7C. Slots 14 and clips 25 are located so that if the clips are properly inserted into slots 14, then first and second connectors 11 and 12 smoothly mate with each other and interface supplementary printed circuit board 7C with main printed circuit board 5.

Figure 5:
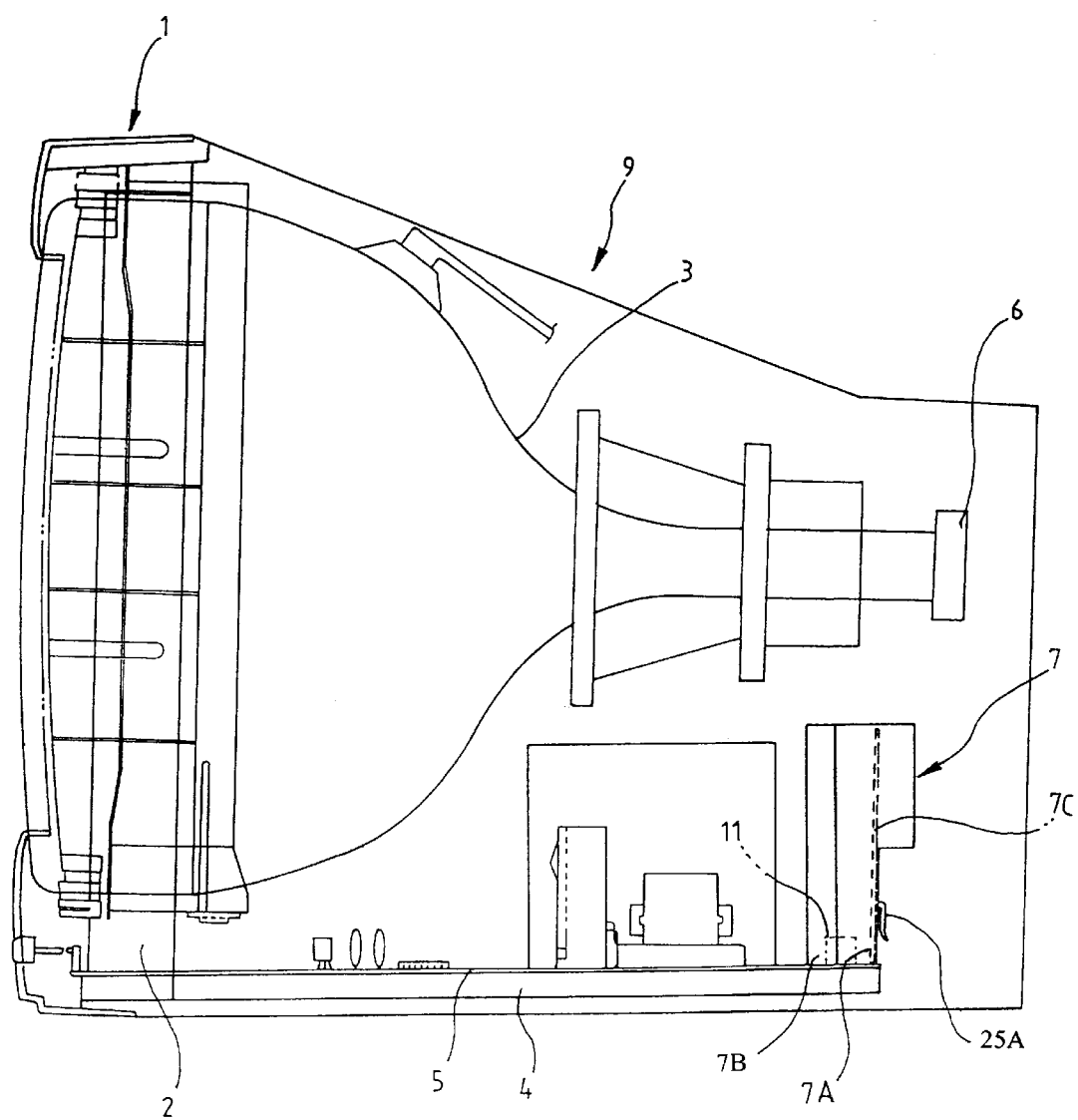
FIG. 5 is a side cross-sectional view illustrating the position of the supplemental printed circuit board package of FIG. 2 when it is installed in a large monitor.

FIG. 5 is a cross-sectional view of the supplemental printed circuit board package installed on the main printed circuit board. While the package is interfaced with the main printed circuit board, clips 25 are coupled to slots 14 of rear wall 20 of first bracket 4. Connectors 11 and 12 make it possible to electrically connect supplemental printed circuit board 7C to main printed circuit board 5. These allows the overall size of the monitor to be decreased.

A monitor using a supplemental printed circuit board package as constructed according to the principles of the present invention avoids having the package rotate when a force is exerted on the package, is easy to install during the manufacturing process, directly interfaces with the main printed circuit board, allows the overall size of the monitor's chassis to be decreased, and increases the efficiency of monitor production.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A monitor having a supplemental printed circuit board, said monitor comprising:
   a chassis having a front cover and rear cover cooperatively enclosing a cathode ray tube, a frame, and a main printed circuit board;
   said frame attached to said chassis, said frame comprising:
      a first bracket supporting said main printed circuit board, said first bracket having a front edge and a rear edge, said rear edge bearing a plurality of slots; and
      a second bracket attached along said front edge of said first bracket, engaging a front side of said cathode ray tube;
   a supplemental printed circuit board package comprising:
      a front shield covering a first side of said supplemental printed circuit board;
      a rear shield covering a second side, opposite to said first side, of said supplemental printed circuit board, said rear shield having a plurality of clips engaging said slots in said first bracket to secure said supplemental printed circuit board package to said frame;
   said supplemental printed circuit board electrically engaging said main printed circuit board while said supplemental printed circuit board package is engaged with said frame.

2. The monitor of claim 1, with said supplemental printed circuit board package further comprising an abutment protruding outward from said rear shield, said abutment contacting a top surface of said rear edge of said first bracket when said clips of said rear shield are engaged with said slots in said first bracket of said frame.

3. The monitor of claim 2, further comprised of one of said clips having a bore fastening said supplemental printed circuit board package to said frame.

4. The monitor of claim 2, further comprised of said clips and said grooves each being two in number.

5. The monitor of claim 2, with said supplemental printed circuit board being oriented substantially perpendicularly to said main printed circuit board while said supplemental printed circuit board package is clipped to said frame.

6. The monitor of claim 1, further comprised of said cathode ray tube presenting a visible screen with 20 or more inches of diagonally measured viewing area.

7. The monitor of claim 1, further comprised of both said first bracket and said second bracket both having substantially rectangular shapes.

8. The monitor of claim 1, further comprised of said second bracket being oriented substantially perpendicularly to said first bracket.

9. A monitor having a supplemental printed circuit board, said monitor comprising:
   a chassis enclosing a cathode ray tube, a frame, and a main printed circuit board; said frame being attached to said chassis, said frame comprising:
      a first bracket supporting said main printed circuit board and having a front edge and a rear edge; and
      a second bracket attached along said front edge of said first bracket and engaging a front side of said cathode ray tube;
   a supplemental printed circuit board package comprising:
      a front shield covering a first side of said supplemental printed circuit board; and
      a rear shield covering a second side, opposite to said first side, of said supplemental printed circuit board, said rear shield having a plurality of clips for engaging said first bracket to secure said supplemental printed circuit board package to said frame;
   said supplemental printed circuit board electrically engaging said main printed circuit board while said supplemental printed circuit board package is engaged with said frame.

10. The monitor of claim 9, further comprising said first bracket having a plurality of slots along said rear edge.

11. The monitor of claim 10, with said supplemental printed circuit board package further comprising an abutment protruding outward from said rear shield, said abutment contacting a top surface of said rear edge of said first bracket when said clips of said rear shield are engaged with said slots in said first bracket of said frame.

12. The monitor of claim 9, further comprised of said clips and said grooves each being two in number.

13. The monitor of claim 9, with said supplemental printed circuit board being oriented substantially perpendicularly to said main printed circuit board while said supplemental printed circuit board package is clipped to said frame.

14. The monitor of claim 13, further comprised of both said first bracket and said second bracket both having substantially rectangular shapes.

15. The monitor of claim 14, further comprised of said second bracket being oriented substantially perpendicularly to said first bracket.

16. A monitor having a supplemental printed circuit board, said monitor comprising: a chassis enclosing a cathode ray tube, a frame, and a main printed circuit board; said frame attached to said chassis, said frame comprising:
   a first bracket supporting said main printed circuit board and having a front edge and a rear edge, said rear edge having a plurality of slots; and
   a second bracket attached along said front edge of said first bracket and engaging a front side of said cathode ray tube; and
   a supplemental printed circuit board package comprising a rear shield covering one side of said supplemental printed circuit board, said rear shield having a plurality of clips engaging said first bracket to secure said supplemental printed circuit board package to said frame, said rear shield having an abutment protruding outward from said rear shield, said abutment contacting a top surface of said rear edge of said first bracket when said clips of said rear shield are engaged with said slots in said first bracket of said frame.

17. The monitor of claim 16, further comprised of both said first bracket and said second bracket both having substantially rectangular shapes.

18. The monitor of claim 16, further comprised of said second bracket being oriented substantially perpendicularly to said first bracket.

19. The monitor of claim 16, further comprised of said clips and said grooves each being two in number.

20. The monitor of claim 16, with said supplemental printed circuit board being oriented substantially perpendicularly to said main printed circuit board while said supplemental printed circuit board package is clipped to said frame.

* * * * *